United States Patent
Chu (10) Patent No.: US 11,914,425 B2
(45) Date of Patent: Feb. 27, 2024

(54) DISPLAY DEVICE HAVING WATERPROOF STRUCTURE AND MANUFACTURING METHOD OF THE SAME (71) Applicant: E Ink Holdings Inc., Hsinchu (TW)

(72) Inventor: Ling-Chiang Chu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 17/646,867

(22) Filed: Jan. 4, 2022

(65) Prior Publication Data
US 2022/0334617 A1 Oct. 20, 2022

(30) Foreign Application Priority Data

Apr. 15, 2021 (TW) .................................. 110113515

(51) Int. Cl.
*G06F 1/16* (2006.01)
*H05K 5/06* (2006.01)

(52) U.S. Cl.
CPC ............. *G06F 1/1656* (2013.01); *H05K 5/06* (2013.01)

(58) Field of Classification Search
CPC ....... G06F 1/1656; G06F 1/1637; H05K 5/06; G02F 1/1339
See application file for complete search history.

(56) References Cited

U.S. PATENT DOCUMENTS

| | | | | |
|---|---|---|---|---|
| 7,787,094 B2* | 8/2010 | Hsu | ....................... | G02F 1/1339 349/190 |
| 8,093,512 B2 | 1/2012 | Chen et al. | | |
| 8,786,820 B2* | 7/2014 | Wu | ......................... | G02F 1/167 349/158 |
| 9,759,979 B2 | 9/2017 | Wu et al. | | |
| 2010/0258346 A1 | 10/2010 | Chen et al. | | |
| 2016/0147097 A1* | 5/2016 | Makino | ................. | G02F 1/1339 349/33 |
| 2017/0336694 A1 | 11/2017 | Wu et al. | | |
| 2019/0254129 A1* | 8/2019 | Cho | ....................... | H05B 33/04 |
| 2020/0019003 A1* | 1/2020 | Zhao | ................. | G02F 1/133308 |

FOREIGN PATENT DOCUMENTS

| | | | |
|---|---|---|---|
| TW | 201220923 A | 5/2012 | |
| TW | 201523080 A | 6/2015 | |

OTHER PUBLICATIONS

Corresponding Taiwan office action dated Apr. 25, 2022.

* cited by examiner

*Primary Examiner* — James Wu
(74) *Attorney, Agent, or Firm* — CKC & Partners Co., LLC (57) ABSTRACT

A display device includes a display panel and a waterproof structure. The display panel includes a driving substrate and a display module. The driving substrate has an integrated circuit. The display module is disposed on the driving substrate, and the integrated circuit is located at a first side of the display module. The waterproof structure surrounds the display module, and the waterproof structure includes a first waterproof material and a second waterproof material. The first waterproof material is at least disposed at the first side of the display module, and the first waterproof material is disposed between the integrated circuit and the display module.

6 Claims, 9 Drawing Sheets

DISPLAY DEVICE HAVING WATERPROOF STRUCTURE AND MANUFACTURING METHOD OF THE SAME

CROSS-REFERENCE TO RELATED APPLICATION

This application claims priority to Taiwan Application Serial Number 110113515, filed Apr. 15, 2021, which is herein incorporated by reference in its entirety.

BACKGROUND

Field of Invention

The present invention relates to a display device and a manufacturing method of the display device, especially for a thinned display device.

Description of Related Art

Regarding to the current thinned display device, fluidal waterproof glue may protrudes from the waterproof membrane of the display device due to capillary phenomena. A size of the structures stacked above the display panel will be limited due to the waterproof glue protruded from the top surface. Or, it is needed to raise the cover structure to prevent the size of the cover structure from being limited by the waterproof glue protruded from the waterproof membrane, and therefore it is against to manufacturing a thinned display device.

Accordingly, it is still a development direction for the industry to provide a thinned display device which may prevent the waterproof structure from protruding from the waterproof membrane.

SUMMARY

One aspect of the present disclosure is a display device.

In some embodiments, the display device includes a display panel and a waterproof structure. The display panel includes a driving substrate and a display module. The driving substrate has an integrated circuit. The display module is disposed on the driving substrate, and the integrated circuit is located at a first side of the display module. The waterproof structure surrounds the display module, and the waterproof structure includes a first waterproof material and a second waterproof material. The first waterproof material is at least disposed at the first side of the display module, and the first waterproof material is disposed between the integrated circuit and the display module.

In some embodiments, the first waterproof material is a solid, and the second waterproof material is a colloid.

In some embodiments, a top surface of the display module facing away from the driving substrate is level with a top surface of the waterproof structure facing away from the driving substrate, and a thickness of the first waterproof material is substantially the same as a thickness of the display module.

In some embodiments, the display panel further includes a waterproof membrane disposed on the display module, a bottom surface of the waterproof membrane facing the display module is level with the top surface of the waterproof structure, and a side wall of the waterproof membrane is level with a side wall of the second waterproof material.

In some embodiments, the waterproof membrane is a touch membrane, and the waterproof membrane includes a printed circuit board, and the printed circuit board of the waterproof membrane and the first waterproof material are located at the same side of the display module.

In some embodiments, the display device further includes a touch module disposed on the display panel and the waterproof structure, and the touch module includes a printed circuit board, and the printed circuit board of the touch module and the first waterproof material are located at the same side of the display module.

In some embodiments, the display device further includes a cover structure disposed on the display panel and the waterproof structure, and the cover structure covers the integrated circuit.

Another aspect of the present disclosure is a manufacturing method of display device.

In some embodiments, the manufacturing method of a display device includes disposing a display module on a driving substrate, disposing a waterproof structure, and removing a periphery portion of the second waterproof material away from the display module such that a top surface of the display module facing away from the driving substrate is level with a top surface of the waterproof structure facing away from the driving substrate. The driving substrate includes an integrated circuit, and the integrated circuit is located at a first side of the display module. Disposing a waterproof structure includes disposing a first waterproof material, and the first waterproof material is at least located at the first side of the display module; disposing a second waterproof material such that the first waterproof material and the second waterproof material collectively surround the display module.

In some embodiments, the manufacturing method of a display device further includes disposing a waterproof membrane on the display module, the first waterproof material, and the second waterproof material before removing the periphery portion of the second waterproof material away from the display module.

In some embodiments, removing the periphery portion of the second waterproof material away from the display module further includes removing a portion of the waterproof membrane overlapping with the periphery portion of the second waterproof material such that a side wall of the waterproof membrane is substantially level with a side wall of the second waterproof material.

In some embodiments, the waterproof membrane includes a printed circuit board, and the printed circuit board of the waterproof membrane and the first waterproof material are located at the same side of the display module.

In some embodiments, the manufacturing method of a display device further includes disposing a touch module on the display module and the waterproof structure after removing the periphery portion of the second waterproof material away from the display module.

In some embodiments, the manufacturing method of a display device further includes disposing a cover structure on the display module and the waterproof structure after removing the periphery portion of the second waterproof material away from the display module.

In the aforementioned embodiments, since the waterproof that is solid (that is, the first waterproof material) is disposed between the integrated circuit and the display module, there is no need to perform the step of removing the waterproof glue at the side where the integrated circuit is located. Therefore, the top surface of the display module facing away from the driving substrate can be level with the top surface of the waterproof structure facing away from the driving substrate by disposing the first waterproof material first and disposing the second waterproof material later. As such, a size of the structures stacked subsequently will not be limited by the waterproof structure, and therefore it is beneficial to manufacturing a thinned display device.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
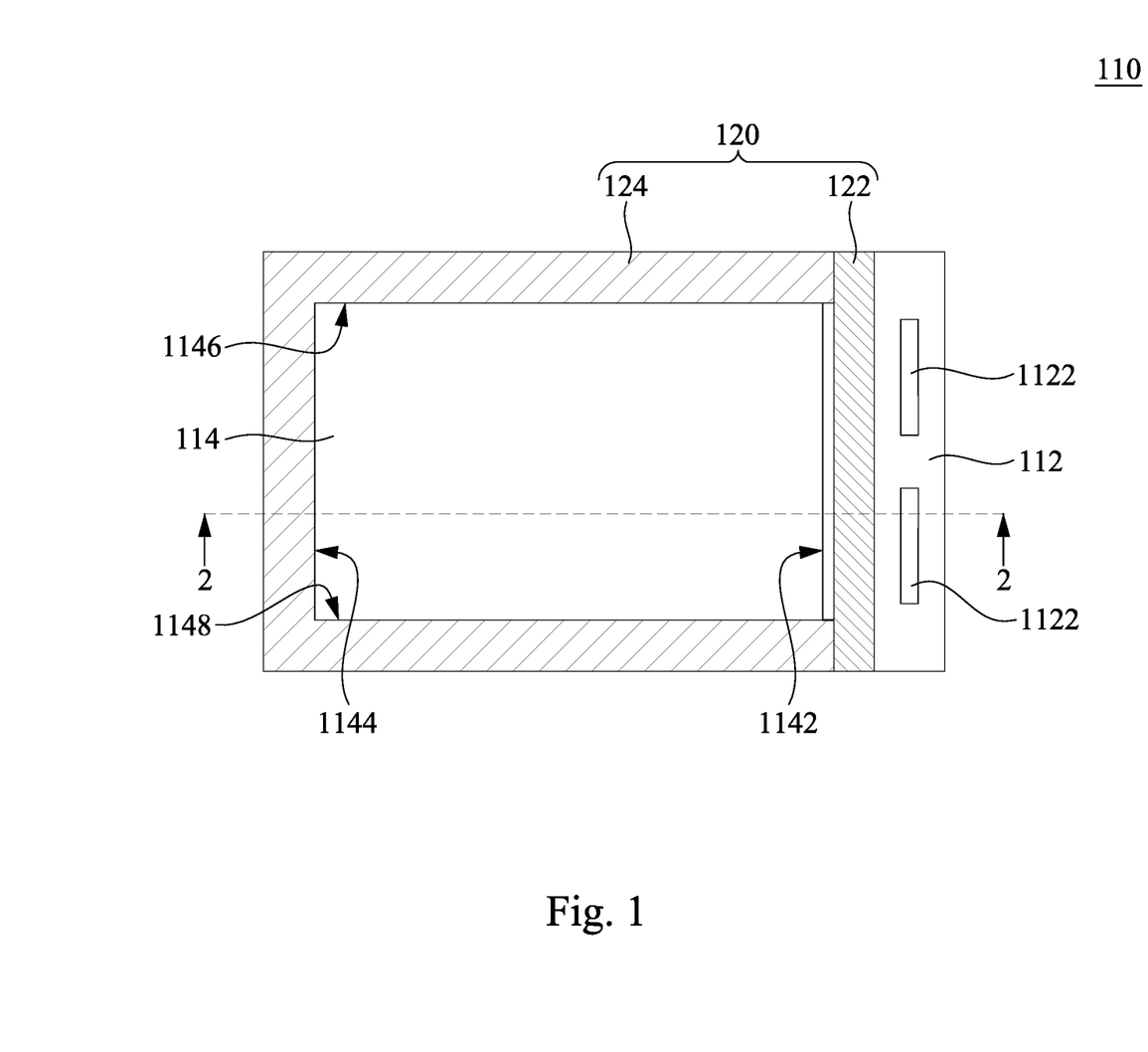
FIG. 1 is a top view of a display device according to one embodiment of the present disclosure.
Figure 2:
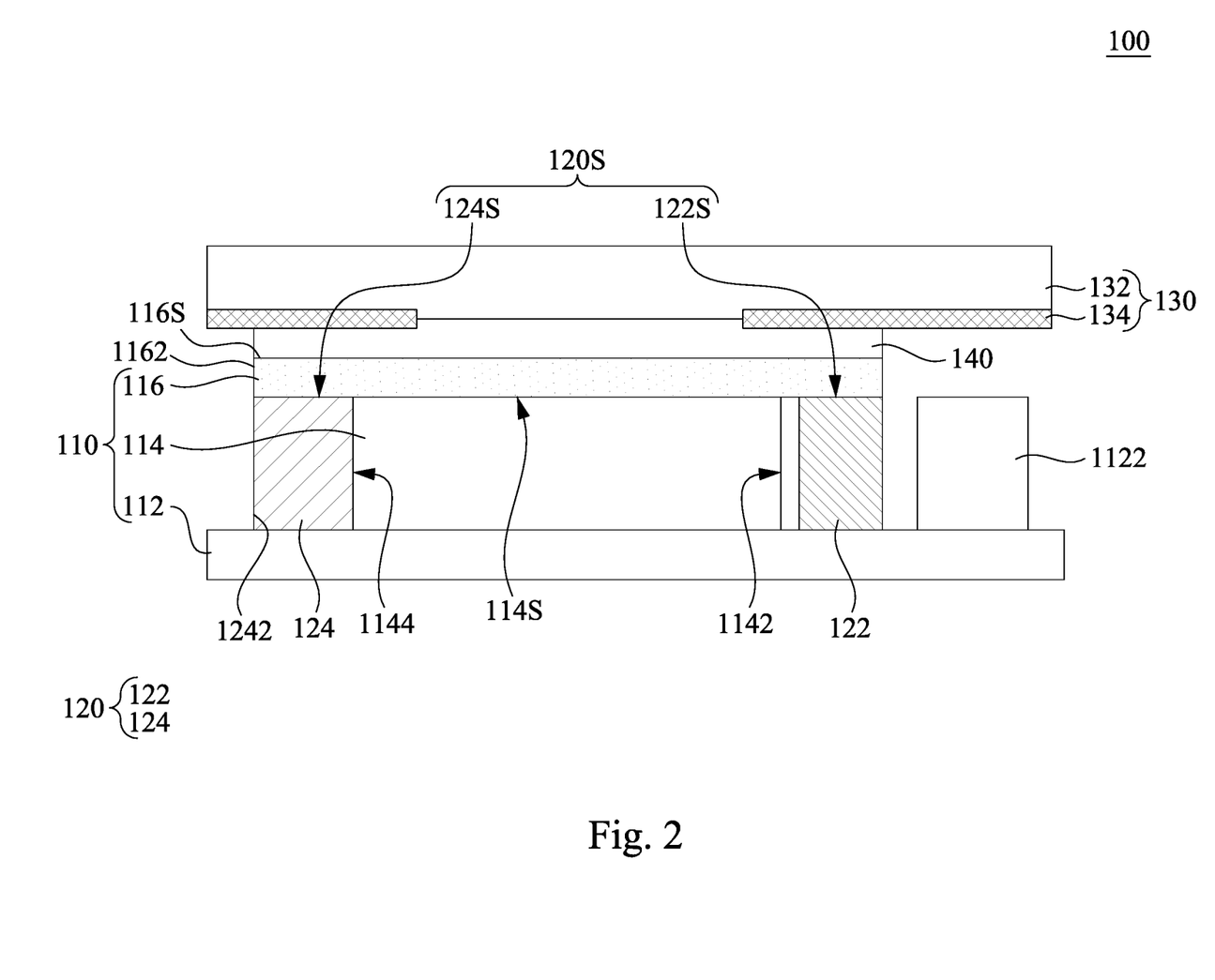
FIG. 2 is a cross-sectional view taken along the line 2-2 in FIG. 1.

FIG. 1 is a top view of a display device 100 according to one embodiment of the present disclosure. FIG. 2 is a cross-sectional view taken along the line 2-2 in FIG. 1. Reference is made to FIG. 1 and FIG. 2 simultaneously. The display device 100 includes a reflective display panel 110, a waterproof structure 120, a cover structure 130, and an adhesive layer 140. The reflective display panel 110 includes a driving substrate 112, a display module 114, and a waterproof membrane 116. The driving substrate 112 includes an integrated circuit 1122. The display module 114 is disposed on the driving substrate 112, and the integrated circuit 1122 is located at a first side 1142 of the display module 114. In order to shown the waterproof structure 120 clearly, the waterproof membrane 116 and the cover structure 130 are omitted. The aforementioned display panel 110 may be non-reflective display panel, or other types of display panel, and the present invention is not limited to the reflective display panel.

The waterproof structure 120 surrounds the display module 114. The waterproof structure 120 includes a first waterproof material 122 and a second waterproof material 124. The first waterproof material 122 is a solid, for example, waterproof tape. The second waterproof material 124 is a colloid, for example, waterproof glue. In the present embodiment, the first waterproof material 122 is disposed at the first side 1142 of the display module 114. In other words, the first waterproof material 122 is disposed between the integrated circuit 1122 and the display module 114. The second waterproof material 124 is located at a second side 1144, a third side 1146, and a fourth side 1148 of the display module 114.

As shown in FIG. 2, a top surface 114S of the display module 114 facing away from the driving substrate 112 is level with a top surface 120S of the waterproof structure 120 facing away from the driving substrate 112. In other words, a top surface 122S of the first waterproof material 122 facing away from the driving substrate 112 is level with a top surface 124S of the display module 114. Specifically, since the first waterproof material 122 is a solid, a thickness of the first waterproof material 122 can be substantially equal to a thickness of the display module 114. In addition, the top surface 120S of the overall waterproof structure 120 surrounding the display module 114 can be flat by disposing the first waterproof material 122 first and disposing the second waterproof material 124 later. Detailed manufacturing method of the aforementioned features will be described in the following paragraphs.

The display device of the present disclosure is a thinned flexible display device, and therefore the fluidic waterproof glue may extend onto the waterproof membrane 116 through capillary phenomena. In other words, the waterproof glue may protrude from a top surface 116S of the waterproof membrane 116 facing away from the display module 114. In other to satisfy the thinning process, it is necessary to remove the waterproof glue protruded from the top surface 116S in the subsequent process such as laser cutting process. However, since the integrated circuit 1122 is connected to the first side 1142 of the display module 114, the cutting process is not able to be performed at the first side 1142 if the waterproof glue is disposed at the first side 1142. As such, a size of the structures stacked above the reflective display panel 110 will be limited due to the waterproof glue protruded from the top surface 116S. For example, when the waterproof glue extends onto the top surface 116S of the waterproof membrane 116, a profile of the cover structure 130 when viewed from above is required to be smaller than a profile of the waterproof membrane 116 when viewed from above. Otherwise, the cover structure 130 cannot be attached due to overlapping with the waterproof glue protruded from the waterproof membrane 116. Or, it is needed to raise the cover structure 130 to prevent the size of the cover structure 130 from being limited by the waterproof glue protruded from the waterproof membrane 116, and therefore it is against to manufacturing a thinned display device.

Regarding the display device of the present disclosure, since the waterproof that is solid (that is, the first waterproof material 122) is disposed between the integrated circuit 1122 and the display module 114, the first waterproof material 122 does not extend onto the waterproof membrane 116. As such, there is no need to perform the step of removing the waterproof glue. In addition, since the second waterproof material is fluidal, the space between the first waterproof material 122 and the second waterproof material 124 can be filled such that the first waterproof material 122 and the second waterproof material 124 can form the waterproof structure 120 surrounding the display module 114 completely. After removing the waterproof glue (that is, the second waterproof material 124) extending onto the waterproof membrane 116, the bottom surface of the waterproof membrane 116 facing the display module 114 (that is, the top surface 114S of the display module 114) is level with the top surface 120S of the waterproof structure 120, and a side wall 1162 of the waterproof membrane 116 is substantially level with a side wall 1242 of the second waterproof material 124.

As shown in FIG. 2, since the waterproof structure 120 does not extend onto the top surface 116S of the waterproof membrane 116, the cover structure 130 can extend and cover the reflective display panel 110 and the waterproof structure 120 completely so as to have an overall planar design. The cover structure 130 includes a protective cover 132 and a printed layer 134. The cover structure 130 can be attached to the waterproof membrane 116 through the adhesive layer 140, and therefore it is beneficial to manufacturing a thinned display device. In addition, the cover structure 130 can cover the integrated circuit 1122, and shield the waterproof structure 120 and the integrated circuit 1122 through the printed layer 134.

Figure 3:
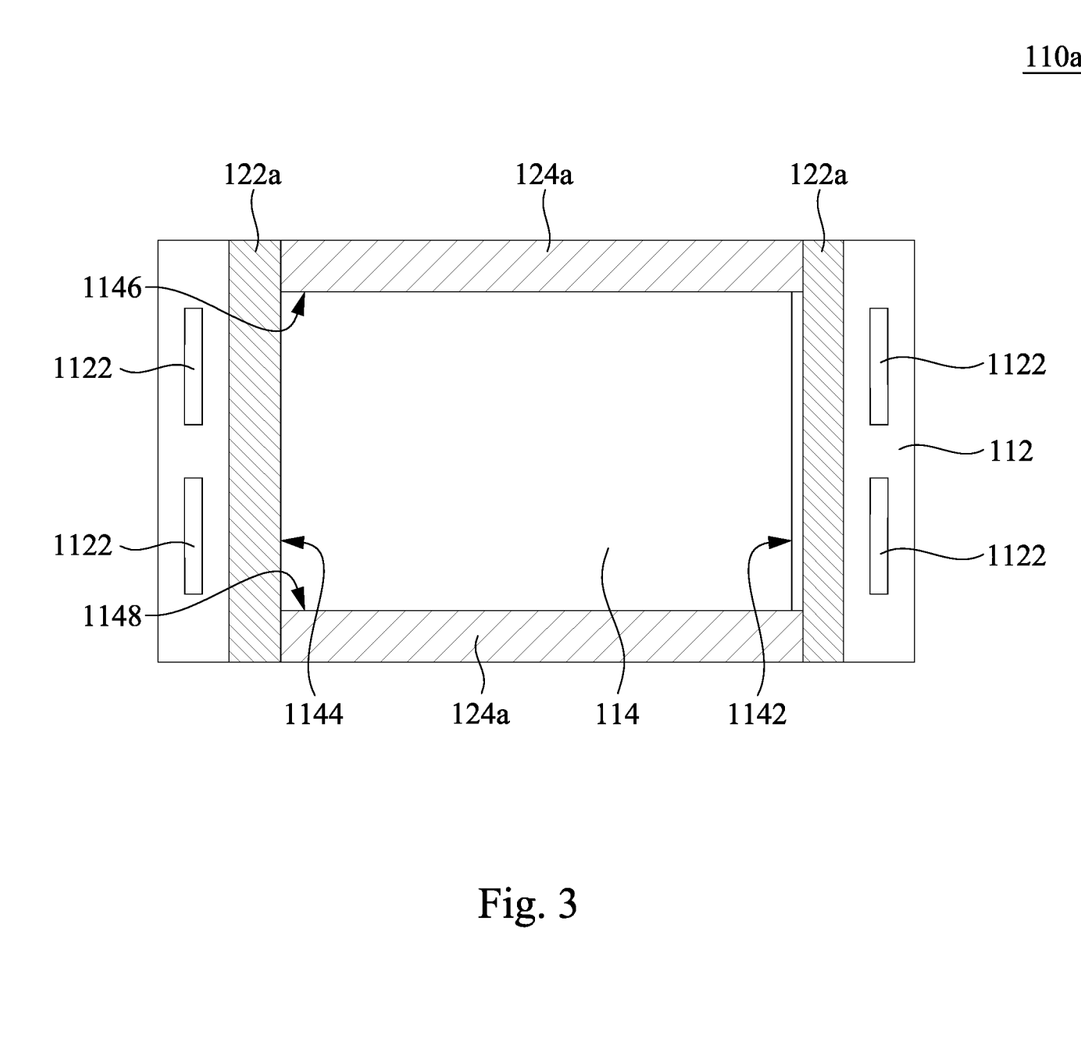
FIG. 3 is a top view of a display device according to another embodiment of the present disclosure.

FIG. 3 is a top view of a display device 100a according to another embodiment of the present disclosure. The display device 100a is substantially the same as the display device 100, and the difference is that the integrated circuit 1122 of the display device 100a is located at the first side 1142 and the second side 1144 of the display module 114. Therefore, the first waterproof material 122a of the display device 100a is disposed at the first side 1142 and the second side 1144 of the display module 114. In other embodiments, the first waterproof material 122a can presented at the third side 1146 or the fourth side 1148. In other words, it is available as long as the first waterproof material 122a is at least presented between the display module 114 and the integrated circuit 1122. The display device 100a has the same technical advantages as the display device 100, and therefore the description is not repeated hereinafter.

Figure 4:
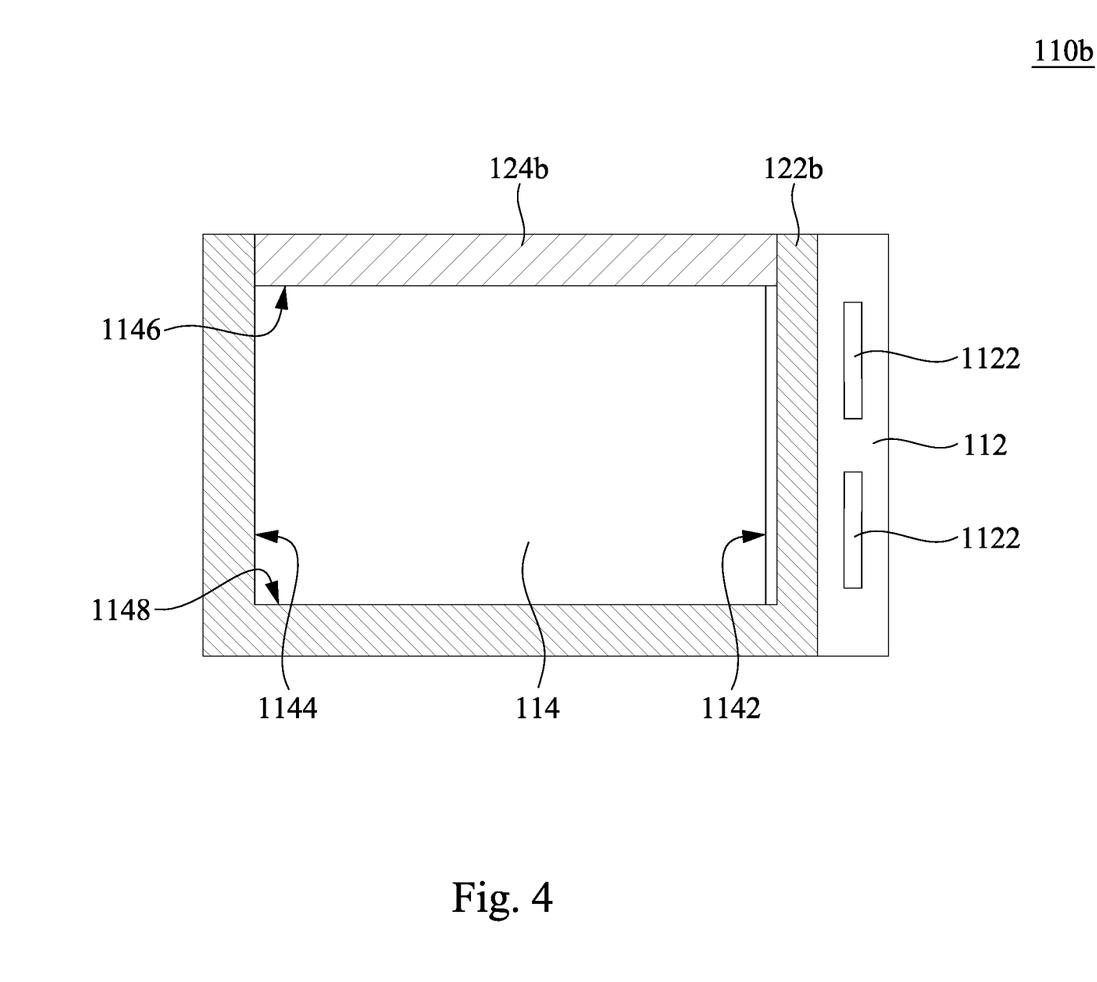
FIG. 4 is a top view of a display device according to another embodiment of the present disclosure.

FIG. 4 is a top view of a display device 100b according to another embodiment of the present disclosure. The display device 100b is substantially the same as the display device 100, and the difference is that the first waterproof material 122b of the display device 100b is located at the first side 1142, the second side 1144, and the fourth side 1148 of the display module 114. In other words, the first waterproof material 122b is at least presented at the side of the display module 114 facing the integrated circuit 1122. The display device 100b has the same technical advantages as the display device 100, and therefore the description is not repeated hereinafter.

Figure 5:
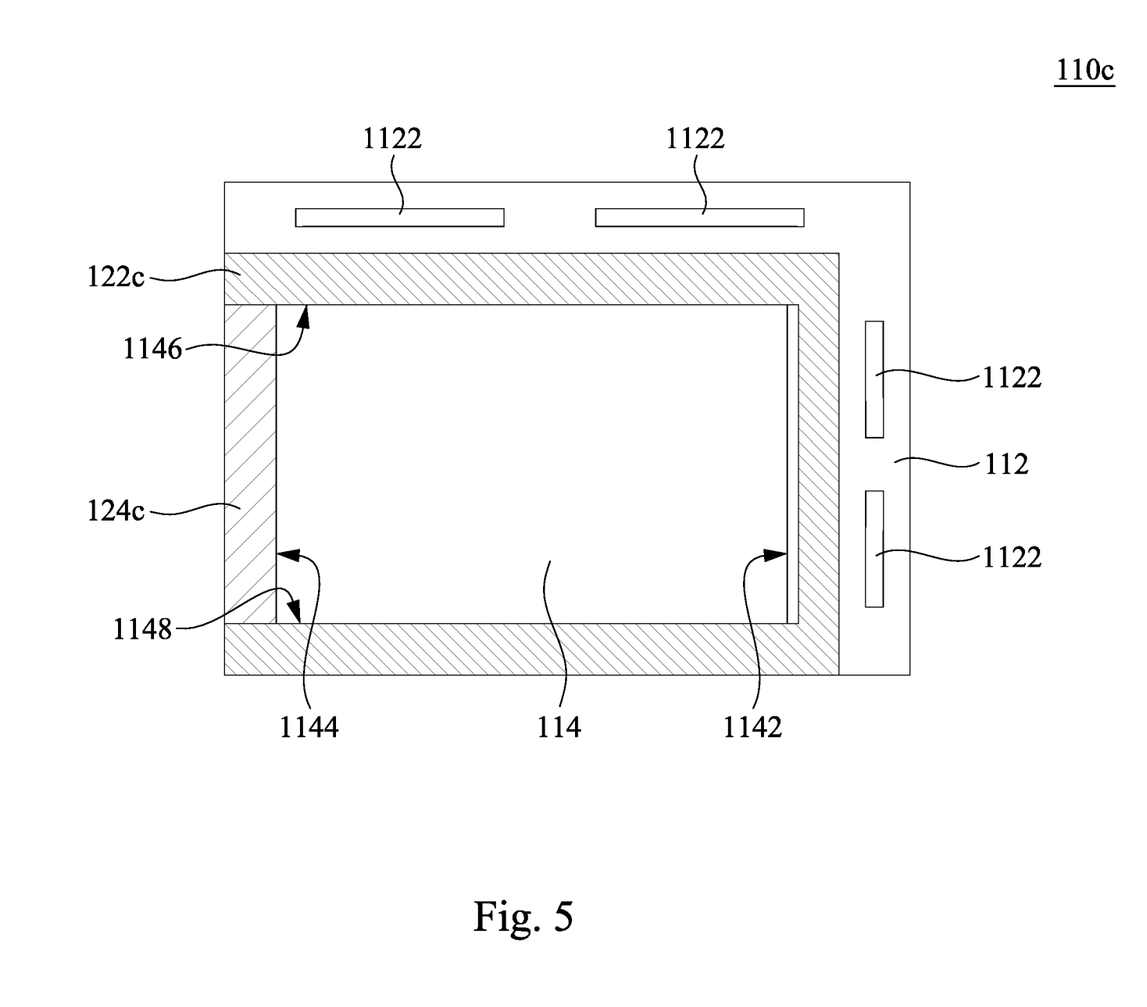
FIG. 5 is a top view of a display device according to another embodiment of the present disclosure.

FIG. 5 is a top view of a display device 100c according to another embodiment of the present disclosure. The display device 100c is substantially the same as the display device 100, and the difference is that the integrated circuit 1122 of the display device 100c is located at the first side 1142 and the third side 1146 of the display module 114. The first waterproof material 122c of the display device 100c is located at the first side 1142, the third side 1146, and the fourth side 1148 of the display module 114. In other words, the first waterproof material 122c is at least presented at the side of the display module 114 facing the integrated circuit 1122. The display device 100c has the same technical advantages as the display device 100, and therefore the description is not repeated hereinafter.

Figure 6:
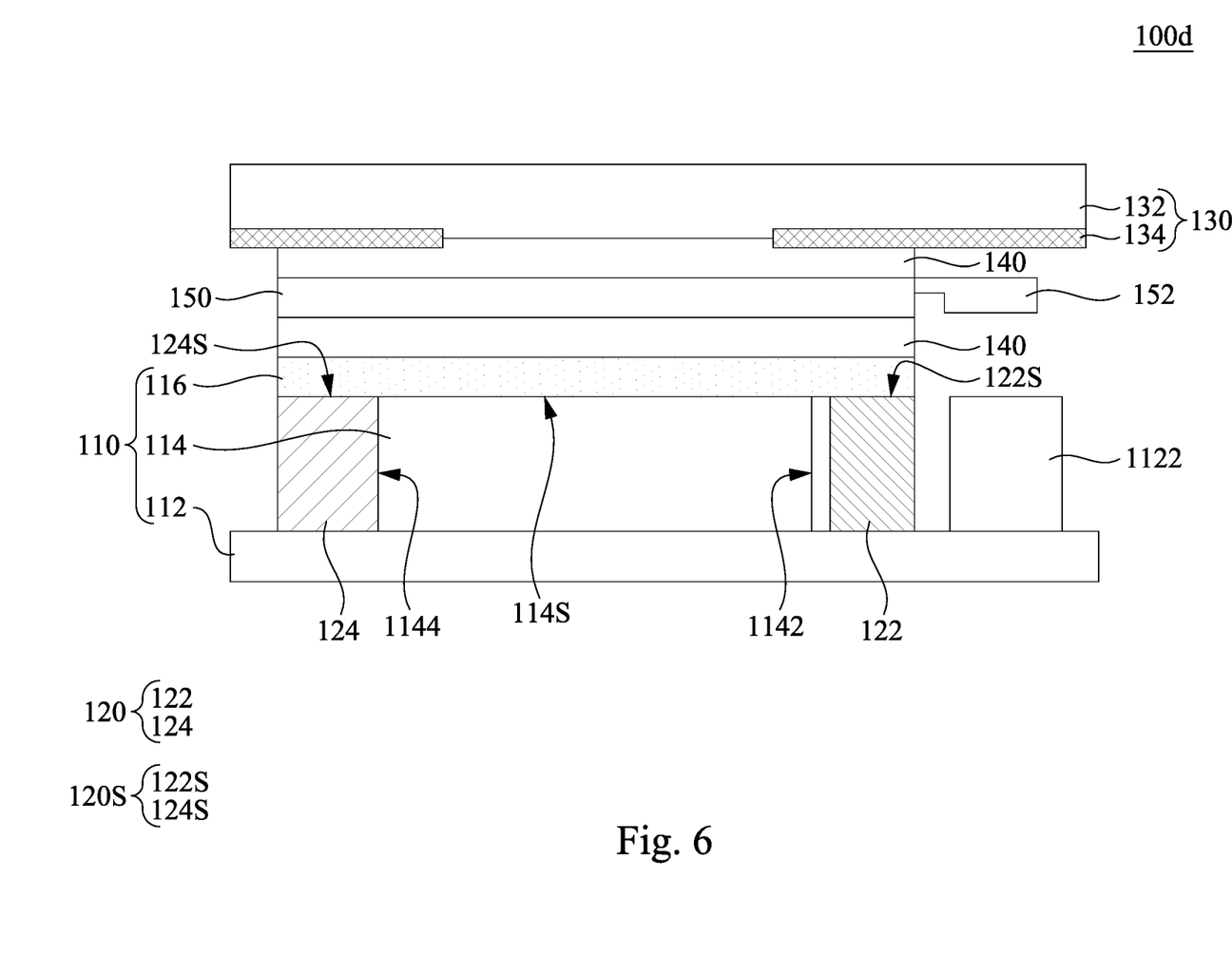
FIG. 6 is a cross-sectional view of a display device according to another embodiment of the present disclosure.

FIG. 6 is a cross-sectional view of a display device 100d according to another embodiment of the present disclosure. The display device 100d is substantially the same as the display device 100, and the difference is that the display device 100d further includes a touch module 150 disposed on the waterproof membrane 116. In the present embodiment, a printed circuit board 152 of the touch module 150 is disposed at the side corresponding to the first side 1142 of the display module 114. In other words, the printed circuit board 152 of the touch module 150 and the first waterproof material 122 are disposed at the same side. In other embodiments, such as the display device 100b as shown in FIG. 4, the printed circuit board 152 of the touch module 150 can be disposed at the second side 1144 where the first waterproof material 122 is located. As such, there is no need to perform the aforementioned step of removing the waterproof glue at the side where the printed circuit board 152 is located. In addition, with such design, sizes of the touch module 150 and the waterproof membrane 116 can be substantially the same. The touch module 150 can be attached to the waterproof membrane 116 through the adhesive layer 140, and therefore it is beneficial to manufacturing a thinned display device 100d.

Figure 7:
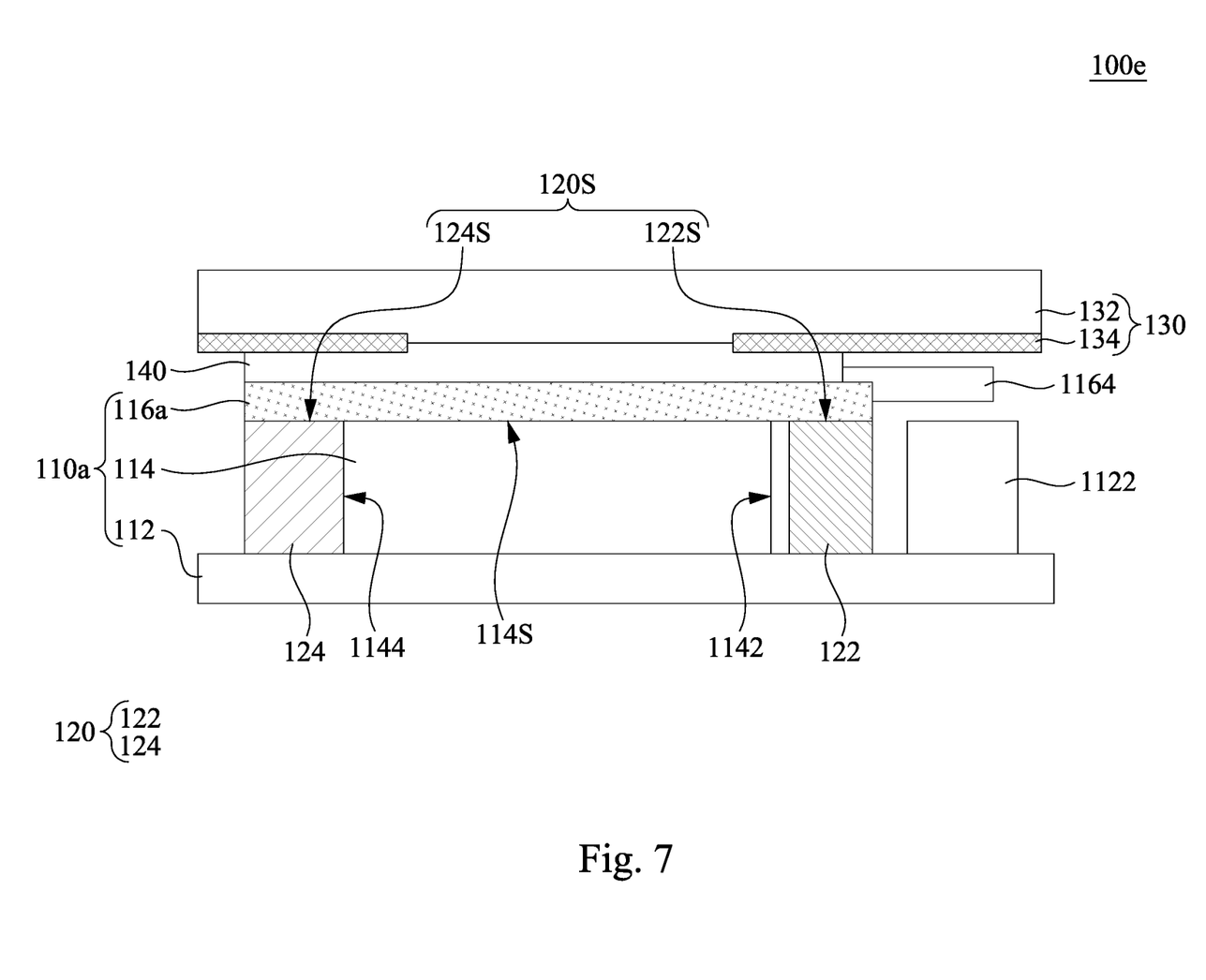
FIG. 7 is a cross-sectional view of a display device according to another embodiment of the present disclosure.

FIG. 7 is a cross-sectional view of a display device 100e according to another embodiment of the present disclosure. The display device 100e is substantially the same as the display device 100, and the difference is that the waterproof membrane 116a of the reflective display panel 110a of the display device 100e is a touch membrane. In other words, the waterproof membrane 116a includes touch electrodes (not shown) and a printed circuit board 1164. As described above, the printed circuit board 1164 of the waterproof membrane 116a and the first waterproof material 122 are located at the same side. As such, there is no need to perform the aforementioned step of removing the waterproof glue at the side where the printed circuit board 1164 is located. In addition, with such design, the thickness of the display device 100e can be further decreased.

Figure 8:
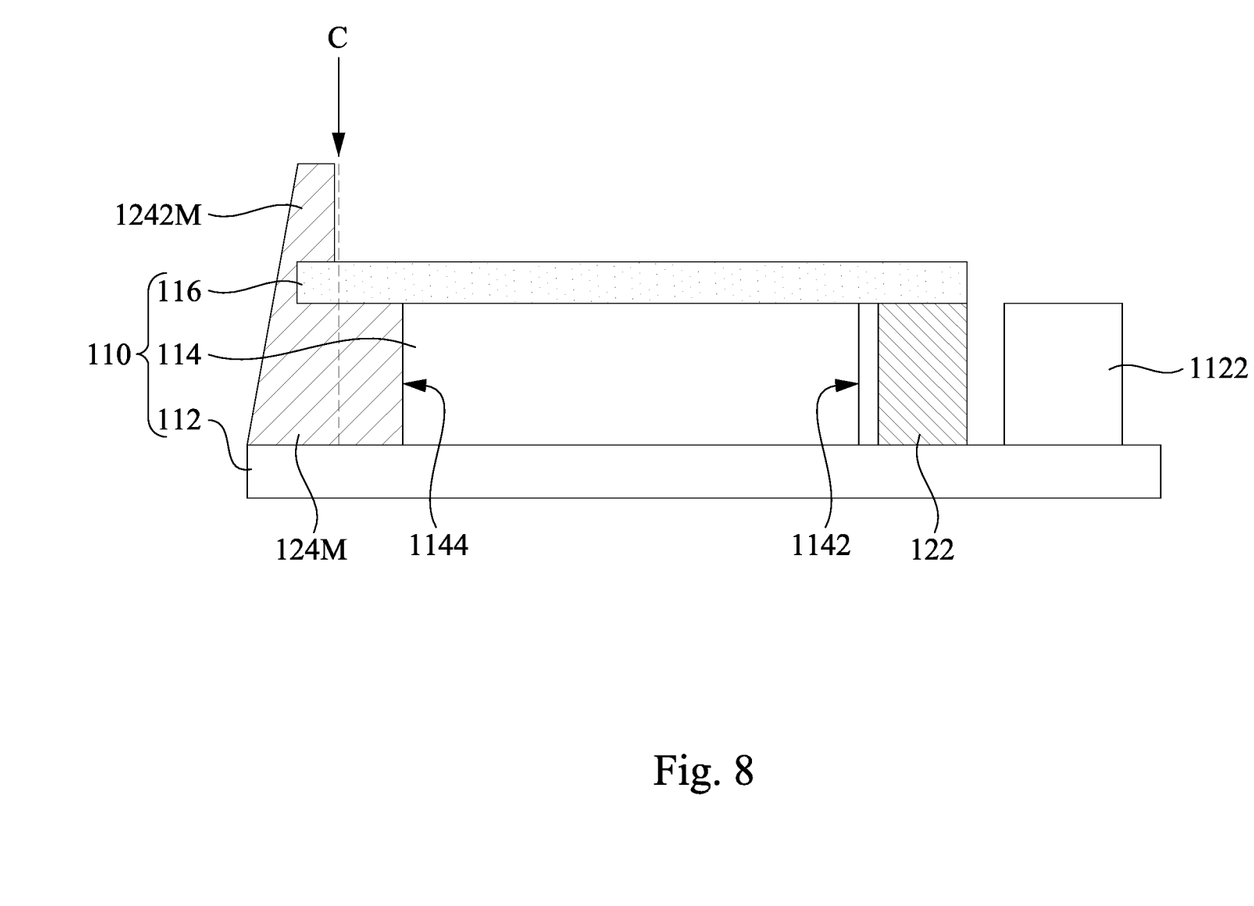
FIG. 8 and FIG. 9 are cross sectional views of intermediate steps of a manufacturing method of the display device in FIG. 1 and FIG. 2.
Figure 9:
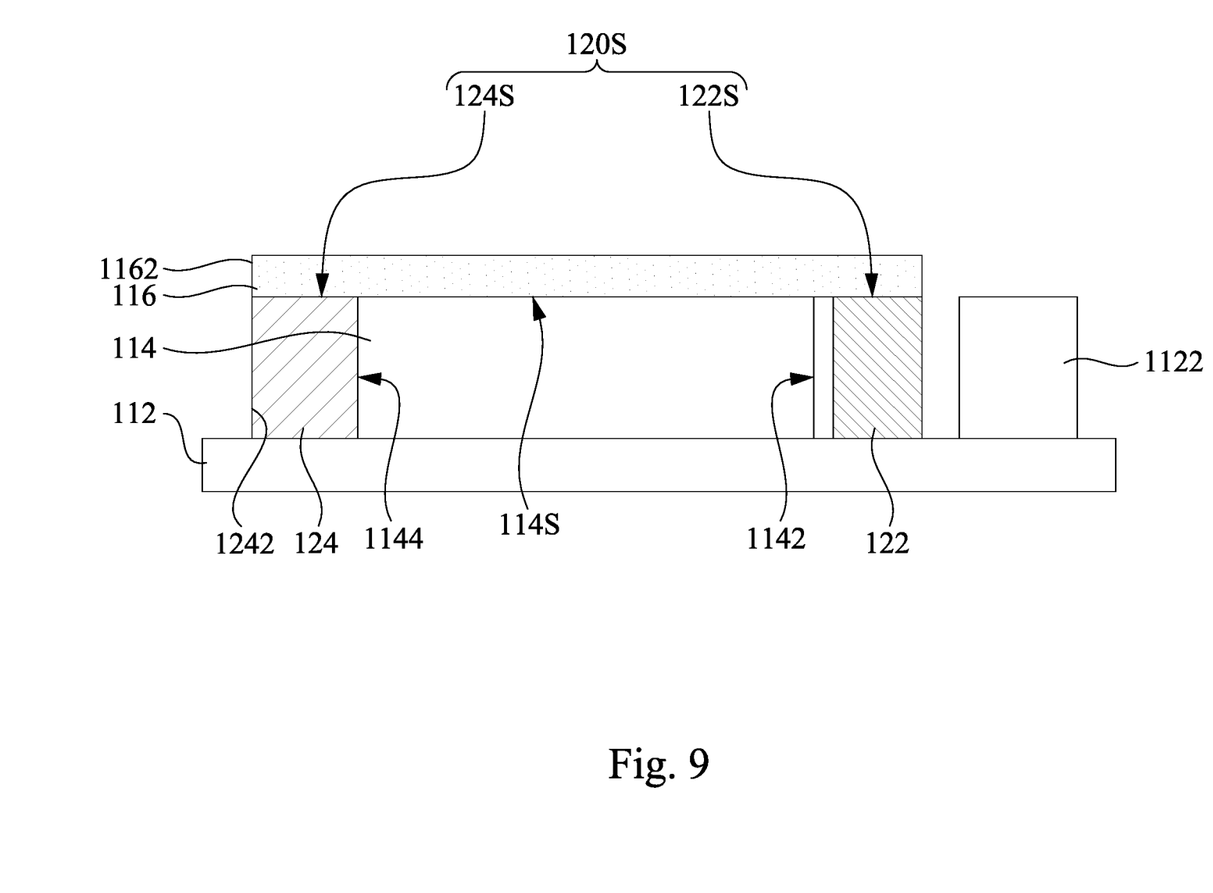

FIG. 8 and FIG. 9 are cross sectional views of intermediate steps of a manufacturing method of the display device 100 in FIG. 1 and FIG. 2. As shown in FIG. 8, in the manufacturing method of the display device 100, the display module 114 is disposed on the driving substrate 112 first, and the integrated circuit 1122 of the driving substrate 112 is located at the first side 1142 of the display module 114. Subsequently, disposing the first waterproof material 122 of the waterproof structure 120, and the first waterproof material 122 is at least located at the first side 1142 of the display module 114. Since the first waterproof material 122 is solid, the thickness of the first waterproof material 122 can be substantially the same as the thickness of the display module 114.

Subsequently, after disposing the first waterproof material 122, the second waterproof material 124M of the waterproof structure 120 is disposed. Since the second waterproof material 124M is fluidal, the space between the first waterproof material 122 and the second waterproof material 124M can be filled such that the first waterproof material 122 and the second waterproof material 124M can form the waterproof structure 120 (see FIG. 1) surrounding the display module 114 completely. Subsequently, the waterproof membrane 116 is disposed on the display module 114, the first waterproof material 122, and the second waterproof material 124M.

As shown in FIG. 8, the second waterproof material 124M extends onto the waterproof membrane 116, and therefore a periphery portion 1242M of the second waterproof material 124M away from the display module 114 needs to be removed such that the top surface 114S of the display module 114 facing away from the driving substrate 112 can be level with the top surface 120S of the waterproof structure 120 facing away from the driving substrate 112.

The step of removing the periphery portion 1242M of the second waterproof material 124M away from the display module 114 can be performed by laser cutting. For example, it can be performed by cutting the periphery portion 1242M of the second waterproof material 124M away from the display module 114 and a portion of the waterproof membrane 116 that is overlapped with the periphery portion 1242M at the cutting position C in FIG. 8.

Reference is made to FIG. 8 and FIG. 9, the top surface 114S of the display module 114 facing away from the driving substrate 112 is level with the top surface 120S of the waterproof structure 120 facing away from the driving substrate 112 after removing the periphery portion 1242M of the second waterproof material 124M away from the display module 114. In addition, the side wall 1162 of the waterproof membrane 116 is substantially level with a side wall 1242 of the second waterproof material 124. In the present embodiment, the example of cutting the second waterproof material 124M located at the second side 1144 is demonstrated as an example. However, this step can be applied for other sides where the second waterproof material 124M are located such as the third side 1146 and the fourth side 1148 as shown in FIG. 1.

Subsequently, touch module 150 and the cover structure 130 can be stacked on the waterproof membrane 116 as shown in FIG. 7. As such, sizes of the touch module 150 and the waterproof membrane 116 can be substantially the same, and the cover structure 130 can extend and cover the reflective display panel 110 and the waterproof structure 120 completely, and therefore it is beneficial to manufacturing a thinned display device.

As described above, regarding the display device of the present disclosure, since the waterproof that is solid (that is, the first waterproof material) is disposed between the integrated circuit and the display module, there is no need to perform the step of removing the waterproof glue at the side where the integrated circuit is located. Therefore, the top surface of the display module facing away from the driving substrate can be level with the top surface of the waterproof structure facing away from the driving substrate by disposing the first waterproof material first and disposing the second waterproof material later. As such, a size of the structures stacked subsequently will not be limited by the waterproof structure, and therefore it is beneficial to manufacturing a thinned display device.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display device, comprising:
   a display panel, comprising:
      a driving substrate comprising an integrated circuit; and
      a display module disposed on the driving substrate, wherein the integrated circuit is located at a first side of the display module; and
   a waterproof structure surrounding the display module, wherein the waterproof structure comprising a first waterproof material and a second waterproof material, wherein the first waterproof material is a solid, and the second waterproof material is a colloid, the first waterproof material is at least disposed at the first side of the display module, the first waterproof material is disposed between the integrated circuit and the display module, and the second waterproof material is not disposed between the display module and the first waterproof material.

2. The display device of claim 1, wherein a top surface of the display module facing away from the driving substrate is level with a top surface of the waterproof structure facing away from the driving substrate, and a thickness of the first waterproof material is substantially the same as a thickness of the display module.

3. The display device of claim 2, wherein the display panel further comprises a waterproof membrane disposed on the display module, and a bottom surface of the waterproof membrane facing the display module is level with the top surface of the waterproof structure, and a side wall of the waterproof membrane is level with a side wall of the second waterproof material.

4. The display device of claim 3, wherein the waterproof membrane is a touch membrane, and the waterproof membrane comprises a printed circuit board, and the printed circuit board of the waterproof membrane and the first waterproof material are located at the same side of the display module.

5. The display device of claim 1, further comprising a touch module disposed on the display panel and the waterproof structure, and the touch module comprises a printed circuit board, and the printed circuit board of the touch module and the first waterproof material are located at the same side of the display module.

6. The display device of claim 1, further comprising a cover structure disposed on the display panel and the waterproof structure, and the cover structure covers the integrated circuit.

* * * * *